United States Patent [19]

Asamaki et al.

[11] Patent Number: 4,950,956
[45] Date of Patent: Aug. 21, 1990

[54] PLASMA PROCESSING APPARATUS

[75] Inventors: Tatsuo Asamaki; Kiyoshi Hoshino; Katsumi Ukai; Yoichi Ino; Toshio Adachi; Tsutomu Tsukada, all of Fuchu, Japan

[73] Assignee: Anelva Corporation, Tokyo, Japan

[21] Appl. No.: 96,862

[22] Filed: Sep. 15, 1987

[30] Foreign Application Priority Data

Oct. 8, 1986 [JP] Japan .................................. 61-239764

[51] Int. Cl.$^5$ ................................................ H01J 7/24
[52] U.S. Cl. .......................... 315/111.21; 315/111.41; 315/111.71; 313/231.31
[58] Field of Search ....................... 315/111.21, 111.41, 315/111.71, 111.91, 39; 313/231.31; 219/121.15–121.21, 121.36

[56] References Cited

U.S. PATENT DOCUMENTS

| | | | |
|---|---|---|---|
| 4,521,717 | 6/1985 | Kieser | 315/111.21 |
| 4,694,222 | 9/1987 | Wakalopulos | 315/111.21 |
| 4,707,637 | 11/1987 | Harvey | 315/111.41 |
| 4,727,293 | 2/1988 | Asmussen et al. | 315/111.41 |
| 4,728,863 | 3/1988 | Wertheimer | 315/111.21 |
| 4,767,641 | 8/1988 | Kieser et al. | 315/111.21 |
| 4,767,931 | 8/1988 | Sato et al. | 315/111.21 |
| 4,774,437 | 9/1988 | Helmer et al. | 315/111.41 |

Primary Examiner—Leo H. Boudreau
Assistant Examiner—Michael Razavi
Attorney, Agent, or Firm—Pollock, VandeSande & Priddy

[57] ABSTRACT

A plasma processing apparatus comprises a vacuum vessel, an anode and a cathode arranged in the vacuum vessel, and a discharge producing power source for intermittently producing main discharge between the anode and the cathode to process a substrate arranged in the proximity of the anode and the cathode. The discharge producing power source comprises a magnetic field setting device including magnetic coils arranged closely to the vacuum vessel and having pole pieces and alternate current power sources for the magnetic coils. The plasma processing apparatus is able to remarkably increase processing speeds and considerably reduce the temperature rise and damage therefrom of substrates to be processed. Moreover, the magnetic field setting device is arranged in a small size to make the plasma processing apparatus compact and small-sized.

11 Claims, 6 Drawing Sheets

FIG_1

FIG_2

FIG_3

FIG_4

FIG_5

FIG_6

FIG_7

FIG_8

FIG_9

FIG_10

FIG_11

FIG_12

FIG_13

FIG_14

PLASMA PROCESSING APPARATUS

Background of the Invention

This invention relates to a plasma processing apparatus which is applicable to refinement, etching and film formation of surfaces of objects to be treated (referred to herein simply as "substrate"). The invention is applicable to various apparatuses such as an etching apparatus, sputtering apparatus, CVD apparatus (chemical vapor deposition apparatus), surface oxidation apparatus, asher and the like.

Plasma processing apparatuses of the above have been already disclosed in detail in various publications. For example, "Elementary Knowledge of Film Formation" written by Tatsuo Asamaki, published by Daily Industrial Newspaper Co. discloses various forms of the apparatus in detail which use direct current, alternating current, radio frequency, microwave or the like.

With such hitherto used plasma processing apparatus, various kinds of particles in plasma steadily flow into substrates so that energy included in the particles converts into thermal energy which raises the temperature of the substrates. The superior processing ability of the plasma is limited by the temperature rise. In other words, the temperature rise of the substrate results in the limitation of processing speed, damage to of the substrate, unevenness of processing and the like.

Moreover, magnetic field setting means for producing plasma have been publicly known. For example, there have been "sputtering apparatus" disclosed in Japanese Patent Application Publication No. 27,627/80 and "discharge reactive apparatus using rotating magnetic field" disclosed in Japanese Laid-open Patent Application No. 61-86,942.

Both of these apparatuses comprise magnetic field setting means mainly consisting of Helmholtz coils. In this case, a plurality of large hollow annular coils is provided so as to surround a vacuum vessel and be spaced apart from the vacuum vessel. Therefore, the apparatuses become bulky and the annular coils make it impossible to arrange parts of a magnetic material inside and in the proximity of the coils. It is therefore difficult to implement the apparatus in a system which is functional and compact.

Summary of the Invention

It is a primary object of the invention to provide an improved plasma processing apparatus which is able to remarkably increase the processing speed and considerably reduce the temperature rise and damage to substrates being processed.

It is another object of the invention to provide a plasma processing apparatus whose magnetic field setting means is arranged in a small size to make the plasma processing apparatus small and compact.

In order to achieve these objects, the plasma processing apparatus according to the invention comprises a vacuum vessel, an anode and a cathode arranged in said vacuum vessel and a discharge producing power source means for intermittently producing main discharge between said anode and said cathode to process a substrate arranged in the proximity of said anode and said cathode.

In a preferred embodiment of the invention, the discharge producing power source means comprises magnetic field setting means including magnetic coils arranged closely to said vacuum vessel and having pole pieces and alternate current power sources for the magnetic coils.

The relation between the function and effect of the invention has not been completely understood. However, it is understood that the effect of the invention is closely related to the fact that when an object is subjected to strong laser beams, plasma is produced at the location to cause various reactions or form small apertures by a such a phenomenon as vaporization.

According to the invention, the electric power for plasma processing is supplied intermittently or by pulsation.

This invention resides in the discovery that the large electric power intermittently supplied produces a plasma condition which has never been known at surfaces of a substrate to remarkably increase the processing speeds. If the processing speeds are restrained to the same extent as those of the prior art, the temperature rise and damage of the substrate are greatly reduced.

In order that the invention may be more clearly understood, preferred embodiments will be described, by way of example, with reference to the accompanying drawings.

Detailed Explanation of Preferred Embodiments

Figure 1:
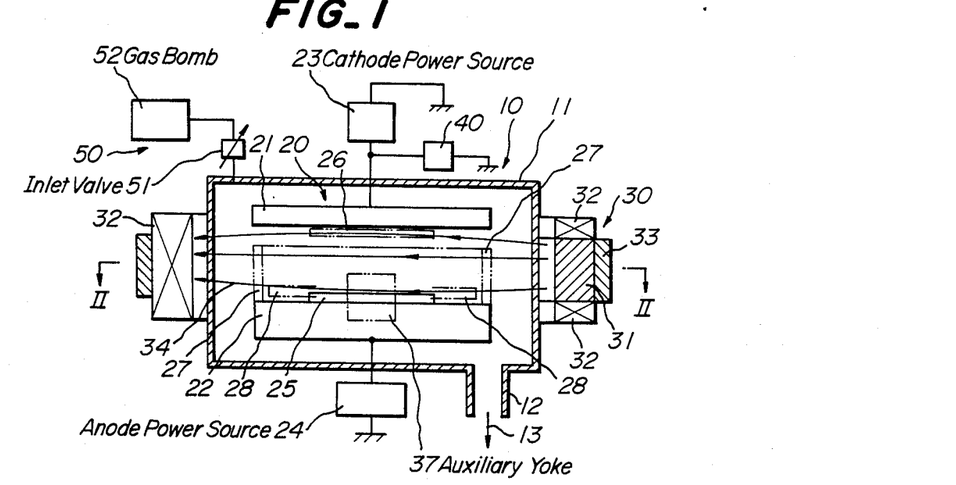
FIG. 1 is a schematic sectional view of a plasma processing apparatus of a first embodiment of the invention.
Figure 2:
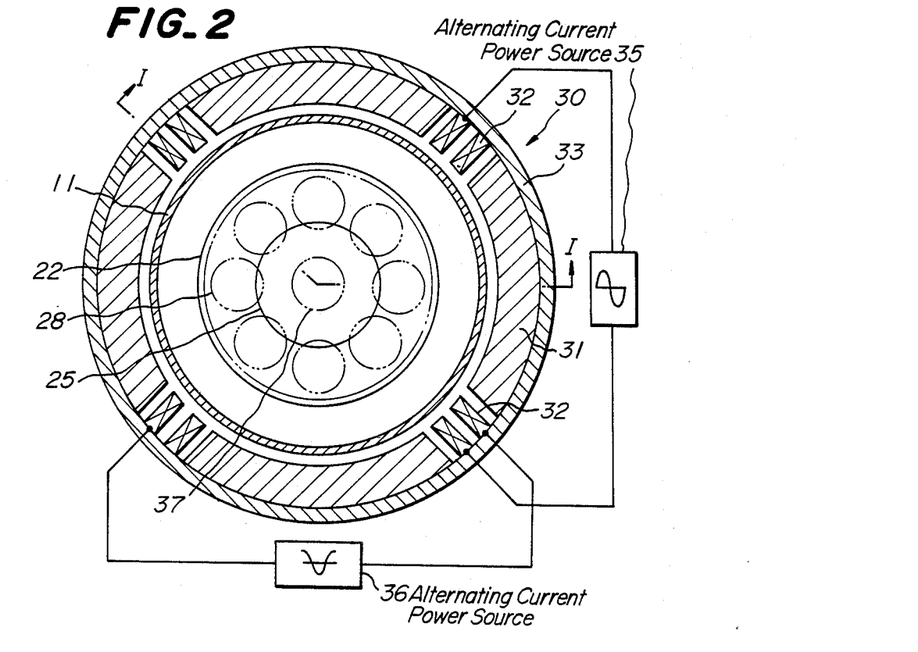
FIG. 2 is a schematic sectional view of the apparatus taken along a line I—I in FIG. 1.
Figure 3:
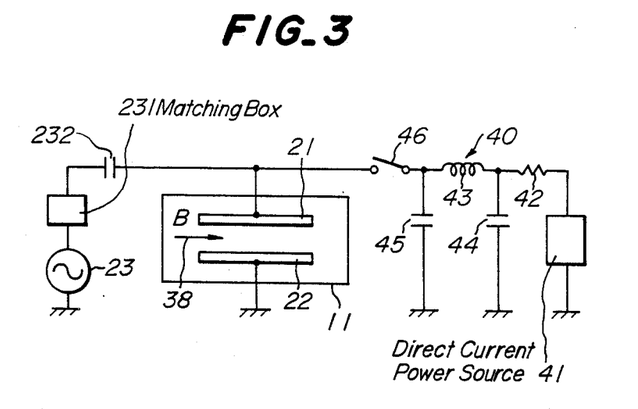
FIG. 3 is a power source for the apparatus shown in FIG. 1 for intermittently producing discharge between electrodes.

Referring to FIGS. 1, 2 and 3 illustrating one embodiment of the invention, the apparatus comprises a vacuum vessel 10 including a processing chamber 11 having an evacuating pipe 12 for evacuating the vacuum vessel 10 as shown by an arrow 13. A processing system 20 in the vacuum vessel 10 comprises a cathode 21 and an anode 22 and a cathode power source 23 and an anode power source 24 for causing discharge between the cathode and anode and controlling the discharge. Reference numeral 25 denotes a substrate to be processed which is located at any location shown in phantom lines shown by 26 or 28 or a location between a wall of the vacuum vessel and either of the electrodes 21 and 22. A cylindrical member 27 shown in phantom lines is an auxiliary electrode which may be provided for enclosing the plasma in the proximity of the anode 22. Although the auxiliary electrode is shown connected to the anode 22, it may be provided on a side of the cathode. As an alternative, the auxiliary electrode is at stray potential or connected to a separately provided power source without being connected to either the anode nor the cathode. A magnetic field setting system 30 comprises pole pieces 31, coils 32 and a yoke 33. Reference numeral 34 designates one example of lines of magnetic force produced. Reference numerals 35 and 36 denote alternating current power sources for the magnetic coils. In this embodiment, phases of the power sources 35 and 36 are shifted by 90° to produce a rotating magnetic field 38 in planes along a surface of the anode 22. An auxiliary yoke 37 serves to control directions of the magnetic field, if required. A power source 40 serves to apply the power intermittently. The feature of supplying the power intermittently is essential for the present invention. Referring to FIG. 3, the power source 40 comprises a direct current power source 41, a ballast resistance 42, a coil 43, a capacitor 44, a main capacitor 45 and a switch 46. The coil 43 and the capacitor 44 are blockers for radio frequency power (13.56 MHz) supplied from a radio frequency power source 23 through a matching box 231 and a blocking condenser 232. The direct current power for main discharge is once accumulated in the main capacitor 45. The switch 46 is switched on and off to effect the main discharge intermittently by direct current pulse power. This main discharge is the magnetron discharge wherein electric and magnetic fields are crossed substantially at right angles, so that discharge impedance is low. Therefore, this main discharge is effective to produce a particular plasma condition with a great electric power.

The magnetic field setting system 30 is located closely to the vacuum vessel 10 and hence the electrodes 21 and 22 and uses the pole pieces, so that the magnetic field setting means is advantageous in making the apparatus small-sized as a whole in comparison with other apparatus using Helmholtz coils. A gas introducing system 50 comprises an inlet valve 51 and a gas bomb with a gas flow meter designated by 52.

This apparatus operates in the same manner as a conventional plasma processing apparatus.

In case of a reactive ion etching apparatus (referred to hereinafter as "RIE apparatus"), for example, after a substrate is arranged at 26 and the processing chamber 11 is evacuated to a predetermined pressure, a predetermined gas (for example, a chlorine series gas for etching an aluminium substrate) is introduced into the processing chamber 11. The coil power sources 35 and 36 and the cathode power source 23 are turned on to effect etching the substrate at a pressure of $1 \times 10^{-2}$ Torrs.

A comparison test of the present invention with the prior art was carried out. Silicon dioxide (SiO$_2$) films on substrates were etched under an atmosphere of introduced trifluoro methane (CHF$_3$) at a pressure of $1 \times 10^{-2}$ Torrs.

Results of the comparison test were as follows. Etching speeds were approximately 500 Å/min when the power flux density on the substrates was 0.25 W/cm$^2$ as applied according to the prior art. In contrast, etching speeds were about 3,000 Å/min when the switch 46 was intermittently turned on and off to change the power flux density of direct current pulse input whose peak values were 5 W/cm$^2$ and mean values were 0.25 W/cm$^2$ (therefore duty ratio being about 1/20). In other words, the etching speeds can be made six times by doubling the electric power. In more detail, the power 0.25 W/cm$^2$ at the cathode power source 23 plus the average power 0.25 W/cm$^2$ at the switch 46 is twice the power 0.25 W/cm$^2$ when the switch 46 is turned off.

The similar increase in etching speed is obtained in various processing such as sputtering, chemical vapor depositing surface oxidizing, asher and the like and respective embodiments later described.

A preferable embodiment will be explained, which is desirable not only for etching but also for all the plasma processing apparatuses (including apparatuses using only ions in the plasma or electrons). It is the most preferable to turn on all the power sources including the power source 24 to effect the processing on the basis of the magnetron discharge.

A substrate may be located at 26 in FIG. 1 when using an RIE apparatus and at 25 or 28 for plasma etching. In forming films and refining surfaces of a substrate, it may be located at a suitable position selected from the above locations 25, 26 and 28, as the case may be. A mode of the apparatus according to the invention where the magnetic field is not impressed is a parallel plate type RIE apparatus which is well known.

The power sources may be operated in various manners. It is desirable to actuate the cathode power source 23 to produce a comparatively weak plasma condition and then to cause the main discharge intermittently. Another method is to make the output of the cathode power source 23 very small or zero as the case may be for the purpose of lowering the temperature rise of a substrate. It is preferable in a further method to turn on the cathode power source 23 in synchronism with the switch 46 to produce weak subdischarge (very weak secondary discharge in consideration of plasma processing) immediately before the main discharge.

Figure 4:
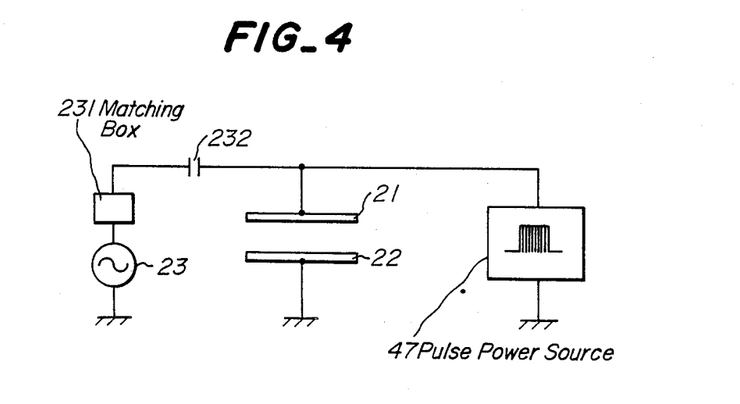
FIG. 4 is a schematic view illustrating another embodiment of the invention.

FIG. 4 illustrates a further embodiment. In this embodiment, a pulse power source 47 is used without using the main capacitor 45 and the switch 46. The pulse power source 47 may be for direct current or alternate current including radio frequency or microwave.

Figure 5:
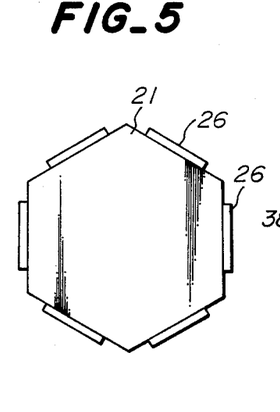
FIGS. 5 and 6 are views showing further embodiments of the invention.
Figure 6:
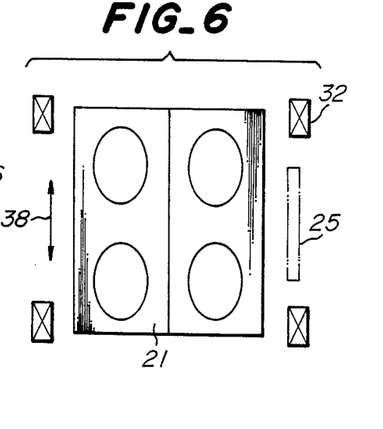

FIGS. 5 and 6 illustrate other embodiments wherein electrodes are coaxially arranged. These embodiments are very effective when a number of substrates are simultaneously processed. Other arrangements and operations are substantially similar to those of the embodiment shown in FIGS. 1-3.

Figure 7:
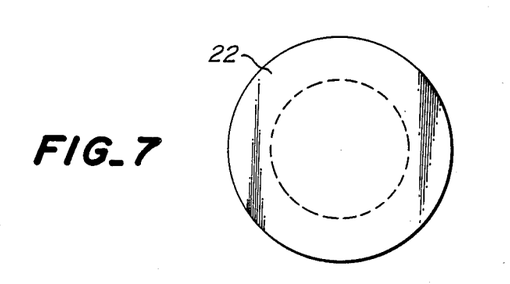
FIGS. 7 and 8 are views illustrating another embodiment of the invention.
Figure 8:
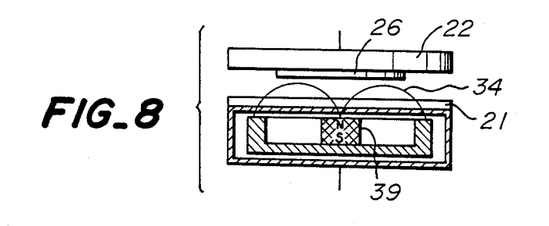

FIGS. 7 and 8 illustrate an embodiment in case of a planer magnetron.

Figure 9:
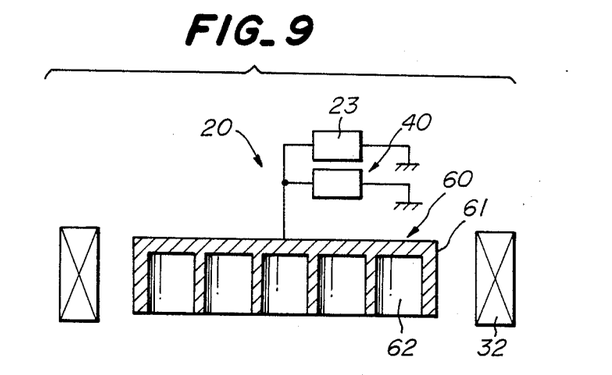
FIGS. 9 and 10 are views showing a further embodiment of the invention.
Figure 10:
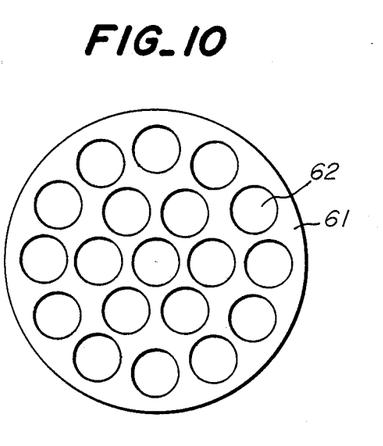

FIGS. 9 and 10 illustrate another embodiment producing so-called hollow cathode discharge. An anode system 60 comprises an anode 61 and hollow portions 62. Parameters of the hollow portions 62 may be freely selected which are arrangement (sparse or dense), configuration (circular or polygonal cylindrical), depth and the like.

Figure 11:
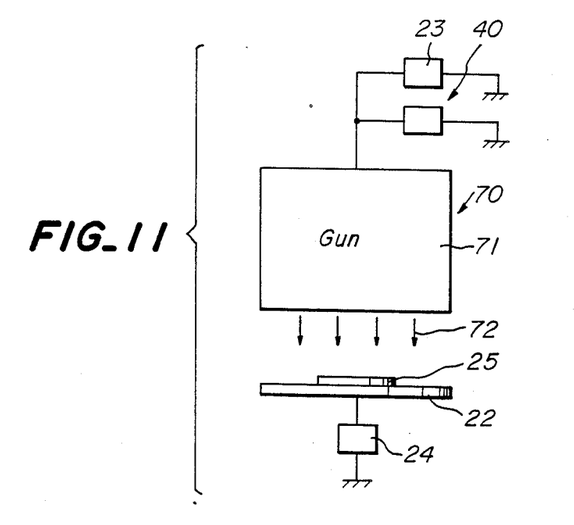
FIG. 11 is a schematic view illustrating one embodiment of the invention.

FIG. 11 illustrates a further general embodiment. In this embodiment, the present invention is applied to a plasma gun 70 having a power source 23 for producing the plasma. The plasma is produced by direct current, alternate current, radio frequency or microwave. A plasma gun, ion gun, electron gun or the like may be used. Particles 72 (ion, electron, radical or the like) are emitted from a gun 71.

Figure 12:
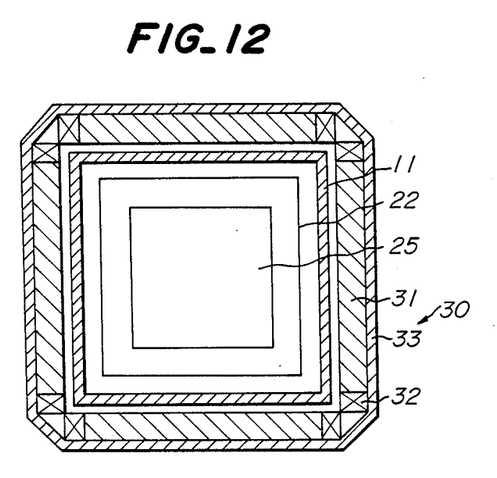
FIGS. 12, 13 and 14 are views illustrating other embodiments of the invention.

FIG. 12 illustrates a further preferable embodiment which is suitable when a substrate 25 is square.

Figure 13:
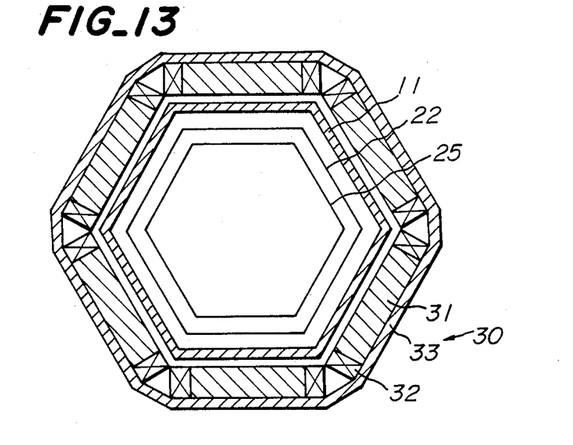

FIG. 13 shows another embodiment which is suitable when a substrate 25 is polygonal such as hexagonal or octagonal or when alternate current of three or more phases is used for the rotating magnetic fields.

Figure 14:
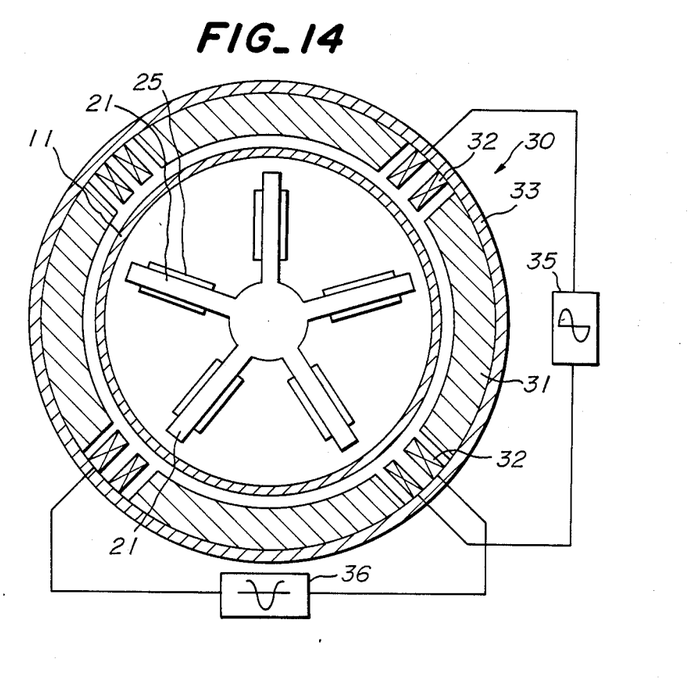

A further embodiment is shown in FIG. 14, wherein cathodes 21 are radially arranged.

The invention is not limited to the above embodiments and various changes and modifications may be made in the invention. For example, the pole pieces used in the above embodiments may be employed in the case of using alternate current of three or more phases for rotating magnetic fields. Moreover, there may be provided a yoke surrounding and connecting the pole pieces, thereby bringing significant effects in plasma processing.

As can be seen from the above explanation, the apparatus according to the invention constructed as above described to be actuated in the above manner can remarkably increase the processing speeds by the plasma and prevent the temperature rise of substrates, damage thereof due to the temperature rise and various damages of the substrates by charged bodies. Moreover, the apparatus according to the invention is compact and small-sized particularly with the aid of the small magnetic field setting means in comparison with the apparatuses of the prior art and greatly improve the productivity.

Furthermore, the apparatus according to the invention is functional because it enables a number of mechanical parts of magnetic materials to be freely arranged about the apparatus. It is particularly possible to make extremely small a space where provision of magnetic material parts is precluded. In the prior art, magnetic material parts could not be arranged in a circle of a large Helmholtz coil, because its magnetic field would be disturbed. When using a yoke in the above embodiments of the invention, particularly, magnetic material parts can be arranged substantially close to the yoke to provide a very functional apparatus.

It is understood by those skilled in the art that the foregoing description is that of preferred embodiments of the apparatus and that various changes and modifications may be made in the invention without departing from the spirit and scope thereof.

What is claimed is:

1. An apparatus for plasma processing a substrate comprising:
    a vacuum vessel;
    an anode and a cathode arranged in said vacuum vessel;
    radio frequency power source means connected between said anode and said cathode for generating and controlling a weak discharge between said anode and said cathode;
    direct current power source means connected between said anode and said cathode periodically switched for intermittently producing a main discharge therebetween at intervals of a period;
    switch means for connecting said direct current power source between said anode and said cathode; and,
    magnetic field setting means provided outside said vacuum vessel and comprising magnetic coils arranged closely to said vacuum vessel, pole pieces and an alternate current power sources for said magnetic coils.

2. An apparatus as set forth in claim 1 wherein said direct current power source means comprises:
    a direct current power source;
    a ballast resistance;
    a main capacitor;
    inhibiting means for radio frequency power supplied from said radio frequency power source means;
    switch means for connecting said direct current power source between said anode and said cathode in a repetition period which as a duty ratio at substantially 0.05;
    said radio frequency power source means comprising a radio frequency signal source, a matching circuit and a blocking capacitor; and,
    said magnetic field setting means comprising magnetic coils arranged closely to said vacuum vessel, pole pieces and alternate current power sources for said magnetic coils.

3. An apparatus as set forth in claim 2, wherein said magnetic field setting means further comprises a yoke surrounding and connecting said pole pieces.

4. A plasma processing apparatus as set forth in claim 2, wherein phases of said alternate current power sources for the magnetic coils are shifted by 90° to produce a rotating magnetic field.

5. An apparatus as set forth in claim 2, wherein said anode and said cathode are polygonal in plan view and said magnetic coils are arranged at apexes of the polygonal anode and cathode.

6. An apparatus as set forth in claim 5, wherein said anode and said cathode are quadrilateral.

7. An apparatus as set forth in claim 5, wherein said anode and said cathode are hexagonal.

8. An apparatus as set forth in claim 2, wherein said cathode has radially extending cathode portions.

9. A plasma processing apparatus as set forth in claim 1, wherein a permanent magnet is arranged under said cathode to form a plasma magnetron.

10. An apparatus as set forth in claim 2, wherein said anode is formed with hollows to produce hollow cathode discharge.

11. An apparatus as set forth in claim 6, wherein said hollows are cylindrical and concentrically arranged.

* * * * *

UNITED STATES PATENT AND TRADEMARK OFFICE
CERTIFICATE OF CORRECTION

PATENT NO.  : 4,950,956
DATED       : August 21, 1990
INVENTOR(S) : Tatsuo Asamaki, et al.

It is certified that error appears in the above-identified patent and that said Letters Patent is hereby corrected as shown below:

Column 1, line 27, delete "of" (second occurrence).

Column 3, line 2, change "nor" to --or--.

Column 3, line 31, change "closely" to --close--.

Column 6, line 18, change "as" to --has--.

Column 6, line 30, change "A plasma processing" to --An--.

Column 6, line 44, change "A plasma processing" to --An--.

Signed and Sealed this

Thirtieth Day of April, 1991

*Attest:*

HARRY F. MANBECK, JR.

*Attesting Officer*   Commissioner of Patents and Trademarks